(12) United States Patent
Kontani

(10) Patent No.: US 7,778,036 B2
(45) Date of Patent: Aug. 17, 2010

(54) STRUCTURE AND METHOD FOR MOUNTING A HEAT-GENERATING COMPONENT

(75) Inventor: Kazuyoshi Kontani, Aichi-ken (JP)

(73) Assignee: Kabushiki Toyota Jidoshokki (JP)

( * ) Notice: Subject to any disclaimer, the term of this patent is extended or adjusted under 35 U.S.C. 154(b) by 0 days.

(21) Appl. No.: 12/467,743

(22) Filed: May 18, 2009

(65) Prior Publication Data

US 2009/0290310 A1 Nov. 26, 2009

(30) Foreign Application Priority Data

May 26, 2008 (JP) .............................. 2008-136935

(51) Int. Cl.
*H05K 7/20* (2006.01)
(52) U.S. Cl. ..................... 361/719; 361/704; 174/52.1; 257/718; 257/719
(58) Field of Classification Search ........................ None
See application file for complete search history.

(56) References Cited

U.S. PATENT DOCUMENTS

| | | | | | |
|---|---|---|---|---|---|
| 5,274,193 | A | * | 12/1993 | Bailey et al. ................ | 174/16.3 |
| 5,309,979 | A | * | 5/1994 | Brauer ......................... | 165/80.2 |
| 5,321,582 | A | * | 6/1994 | Casperson ................... | 361/713 |
| 5,450,284 | A | * | 9/1995 | Wekell ......................... | 361/710 |
| 5,461,541 | A | * | 10/1995 | Wentland et al. ............ | 361/707 |
| 5,526,232 | A | * | 6/1996 | Kolberg et al. .............. | 361/715 |
| 5,995,369 | A | * | 11/1999 | Kiermeier et al. ........... | 361/704 |
| 6,225,559 | B1 | * | 5/2001 | Hubner et al. ............... | 174/542 |
| 6,310,776 | B1 | * | 10/2001 | Byrne et al. ................. | 361/707 |
| 6,337,796 | B2 | * | 1/2002 | Yamada et al. .............. | 361/719 |
| 6,434,006 | B1 | * | 8/2002 | Fukatsu et al. .............. | 361/704 |
| 6,580,612 | B2 | * | 6/2003 | Draad et al. ................. | 361/719 |
| 6,587,344 | B1 | * | 7/2003 | Ross ........................... | 361/704 |
| 6,801,432 | B2 | * | 10/2004 | Petricek ....................... | 361/704 |

FOREIGN PATENT DOCUMENTS

| | | |
|---|---|---|
| DE | 10543260 A1 | 5/1997 |
| DE | 10 2006039506 B3 | 2/2008 |
| JP | 4-93200 | 8/1992 |
| JP | 2000-299580 A | 10/2000 |
| JP | 2002-280776 | 9/2002 |

\* cited by examiner

*Primary Examiner*—Boris L Chervinsky
(74) *Attorney, Agent, or Firm*—Woodcock Washburn LLP

(57) ABSTRACT

A structure for mounting a heat-generating component includes a circuit board on which a heat-generating component is mounted, a base on which the circuit board is disposed upright, a cover having thermal conductivity, a heat-conductive member electrically isolated from the heat-generating component and a heat transfer plate. The heat transfer plate is attached to the circuit board so as to extend in the sliding direction of the cover to cover a surface of the heat-conductive member. The cover presses the heat transfer plate by an inner surface thereof against the heat-conductive member in a direction perpendicular to the heat-conductive member so that the heat-generating component is thermally connected to the inner surface of the cover through the heat-conductive member and the heat transfer plate.

9 Claims, 3 Drawing Sheets

STRUCTURE AND METHOD FOR MOUNTING A HEAT-GENERATING COMPONENT

CROSS REFERENCE OF RELATED APPLICATION

This application claims priority to Japanese Patent Application No. 2008-136935 filed May 26, 2008.

BACKGROUND

The present invention relates to a structure and a method for mounting a heat-generating component on a circuit board accommodated in a space defined between a cover and a base so that heat generated by the heat-generating component is dissipated to the cover.

An electronic control unit for an industrial vehicle, for example, includes a heat-generating component such as a transistor mounted on a printed substrate in use for a circuit board accommodated in a casing. However, excessive heat generated by the heat-generating component is liable to cause the heat-generating component to incur a thermal destruction. To solve this problem, Japanese Patent Application Publication No. 2002-280776 discloses such a structure that heat generated by a heat-generating component is dissipated to a casing to suppress an excessive rise in temperature of the heat-generating component.

The structure for mounting a heat-generating element (or heat-generating component) disclosed in the above reference No. 2002-280776 includes a casing having therein a printed circuit board on which a heat-generating element is mounted and a heat-conductive sheet interposed between and in touch with the heat-generating element and the casing. Specifically, the heat-conductive sheet is pressed by the casing to be in contact with the heat-generating element so that heat generated by the heat-generating element is reliably transferred to the heat-conductive sheet and dissipated to the casing.

A structure for mounting a heat-generating element is generally arranged in such a way that a circuit board on which a heat-generating element is mounted is horizontally disposed in a casing and a heat-conductive sheet is provided above the surface of the heat-generating element, as disclosed in the reference No. 2002-280776. In this structure, the casing or the like presses the heat-conductive sheet from above against the heat-generating element so that the heat-conductive sheet and the heat-generating element are kept in contact with each other. On the other hand, there is known another structure for mounting a heat-generating element which is arranged in such a way that a circuit board is vertically disposed in a casing so as to extend in a sliding direction of a cover. In this case, the surface of the heat-generating element is substantially parallel to the sliding direction of the cover. Thus, the cover in sliding movement needs to press at the inner surface thereof the heat-conductive sheet against the heat-generating element. However, there is a problem with this structure in that the heat-conductive sheet is generally adhesive and, therefore, the heat-conductive sheet is adhered to and dragged by the sliding cover. As a result, the heat-conductive sheet is deformed or damaged and cannot be reliably pressed to contact with the surface of the heat-generating element. If the distance between the inner surface of the cover and the heat-conductive sheet is large enough to prevent the heat-conductive sheet from being dragged by the sliding cover, there arises another problem in that the heat-conductive sheet can not be sufficiently pressed to contact with the surface of the heat-generating element.

The present invention, which has been made in view of the above-described problems, is directed to a structure and a method for mounting a heat-generating component which prevent deformations of a heat-conductive member in sliding movement of the cover and ensures reliable pressing contact between the heat-conductive member and the surface of the heat-generating component.

SUMMARY

In accordance with an aspect of the present invention, a structure for mounting a heat-generating component includes a circuit board on which a heat-generating component is mounted, a base on which the circuit board is disposed upright, a cover having thermal conductivity, a heat-conductive member thermally connected to and electrically isolated from the heat-generating component, and a heat transfer plate. The heat transfer plate is attached at one end thereof to the circuit board so as to extend in the sliding direction of the cover to cover a surface of the heat-conductive member. The cover presses the heat transfer plate by an inner surface thereof against the heat-conductive member in a direction perpendicular to the heat-conductive member so that the heat-generating component is thermally connected to the inner surface of the cover through the heat-conductive member and the heat transfer plate.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF ILLUSTRATIVE EMBODIMENTS

Figure 1:
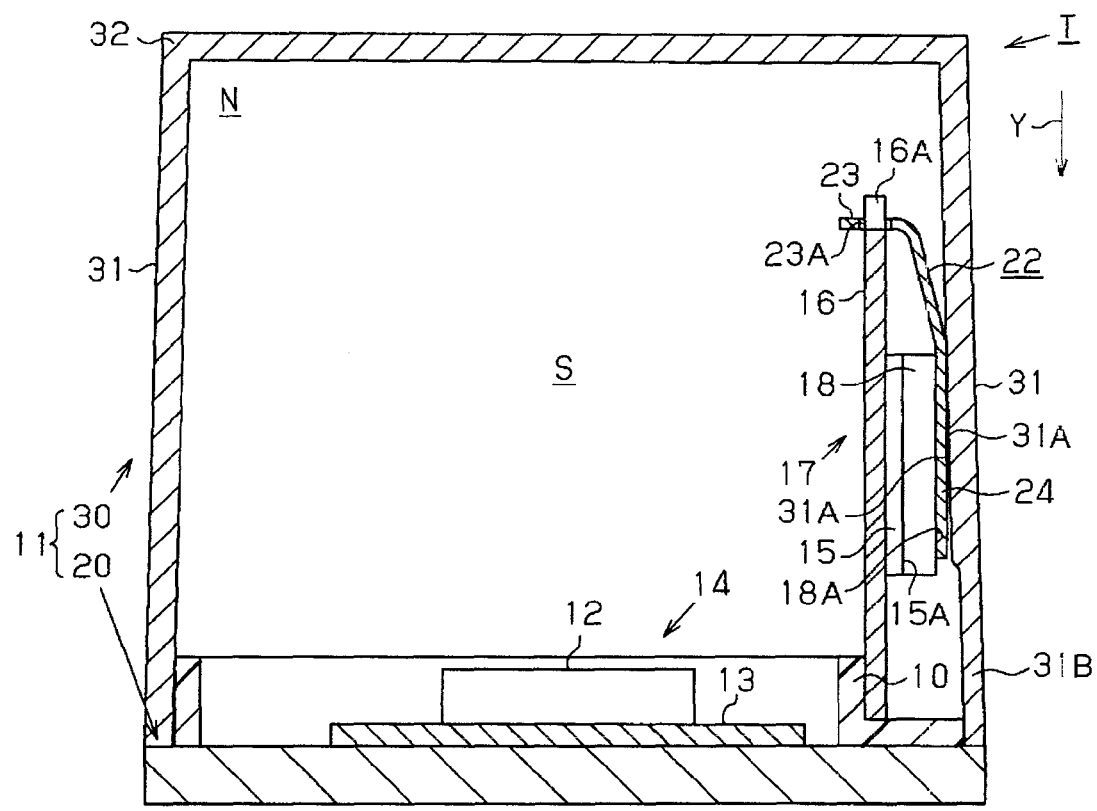
FIG. 1 is a cross-sectional view of an electronic control unit according to a preferred embodiment of the present invention.

The following will describe the preferred embodiment with reference to FIGS. 1 through 5, in which the present invention is applied to a structure and a method for mounting a heat-generating component used in an electronic control unit for an industrial vehicle. Referring to FIG. 1, reference symbol T designates the electronic control unit for an industrial vehicle (not shown). The electronic control unit T includes a casing 11 accommodating therein a power circuit 14 and a drive circuit 17. The power circuit 14 has a circuit board 13 on which a power semiconductor device 12 is mounted. The drive circuit 17 has a circuit board 16 on which an electronic component 15 for controlling the power semiconductor device 12 of the power circuit 14 is mounted. The electronic component 15 is a heat-generating component such as a power device, e.g. transistor, which is in the shape of a rectangular sheet in plan view.

The casing 11 includes a base 20 having on the upper surface thereof a frame 10 and a cover 30. The base 20 is in the form of a plate made of a copper alloy. The frame 10 is in the form of a rectangular shape made of a resin and opened at the top and bottom thereof. The cover 30 is in the form of a box opened at the bottom thereof. To form the casing 11, the cover 30 is mounted on the base 20 by sliding the cover 30 toward the base 20 along the vertical outer surface of the frame 10 in arrow direction Y as indicated in FIG. 1. Thus, a space S for accommodating the power circuit 14 and the drive circuit 17 is defined between the base 20 and the cover 30.

Figure 3:
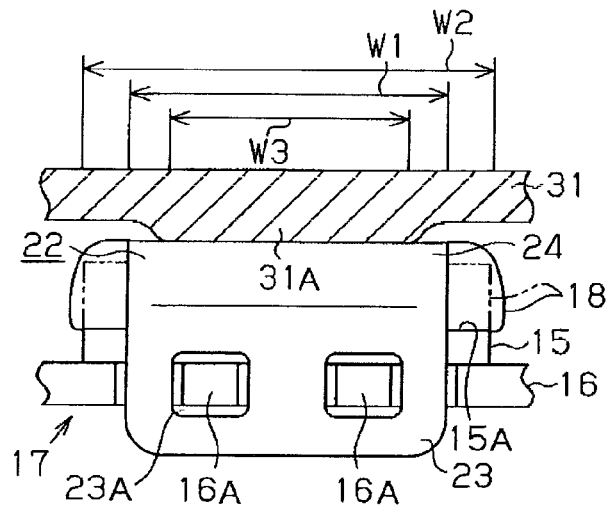
FIG. 3 is a cross-sectional plan view showing the heat transfer plate pressed by a pressing protrusion formed from a sidewall of a cover according to the preferred embodiment of the present invention.
Figure 5:
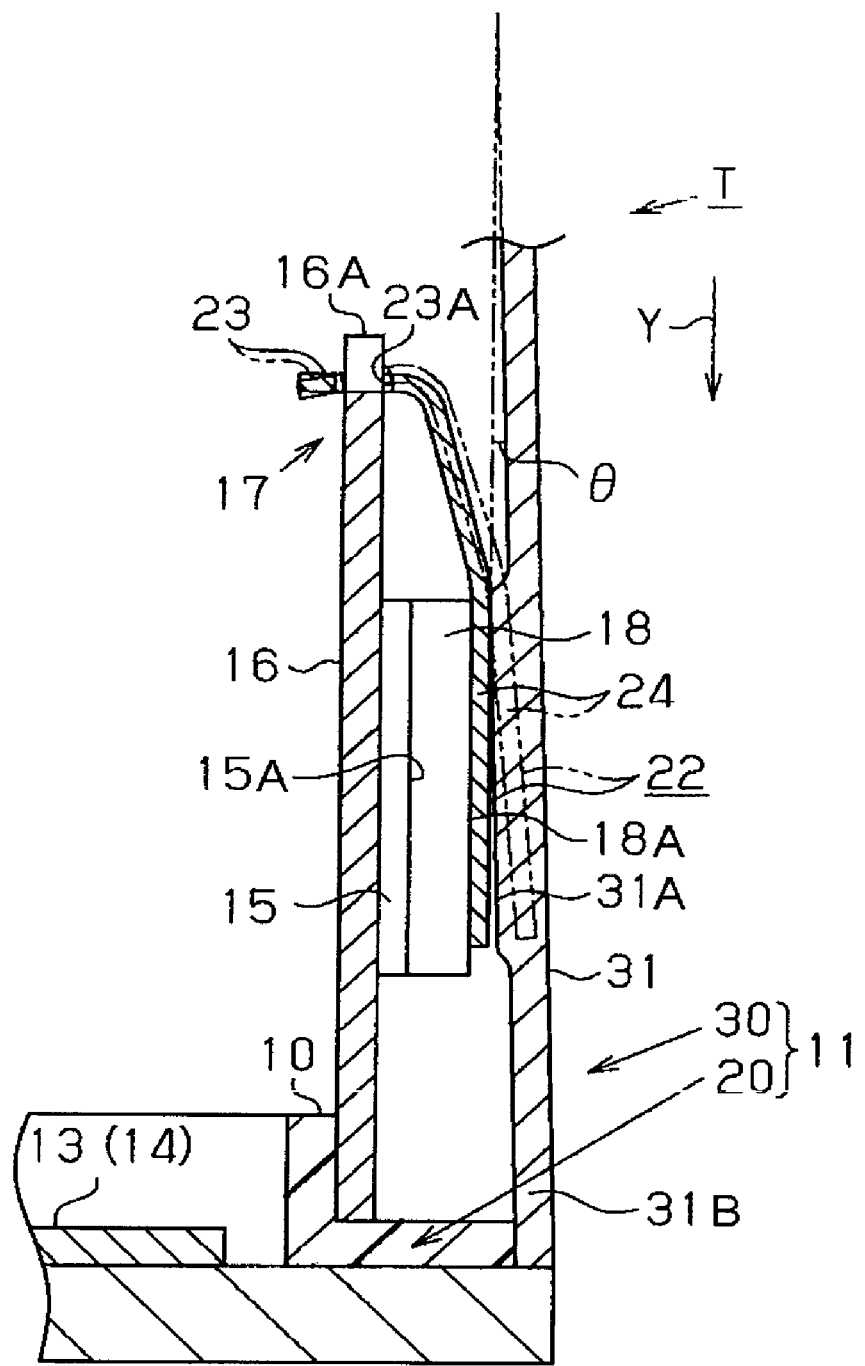
FIG. 5 is a partial cross-sectional view showing the cover mounted on the base according to the preferred embodiment of the present invention.

The cover 30 is formed of a top wall 32 and four sidewalls 31 extending downwardly from four edges of the top wall 32 respectively to be a box shape opened at the bottom. The cover 30 is made of a die cast aluminum alloy. Each sidewall 31 of the cover 30 is inclined slightly outwardly from the top wall 32 to the lower end thereof so that the internal space N formed within the cover 30 is increased toward the bottom of the casing 11. That is, as shown in FIG. 5, each sidewall 31 is inclined at an angle of θ with respect to the sliding direction Y of the cover 30. As shown in FIGS. 1 and 3, one of the sidewalls 31 facing the drive circuit 17 is provided with a pressing protrusion 31A which protrudes from the inner surface of the sidewall 31 inward extending from the upper end of the sidewall 31 at the top wall 32 toward the lower end of the sidewall 31 with a constant width.

When the cover 30 is mounted on the base 20, each sidewall 31 is engaged at each end 31B thereof with the outer surface of the frame 10. This engagement serves as a positioning means to position the cover 30 with respect to the base 20.

The power circuit 14 is fixedly mounted on the base 20 in the casing 11 in such a manner that the circuit board 13 is arranged parallel to the base 20. On the other hand, the drive circuit 17 is fixed to a step provided on one side of the frame 10 in the casing 11 in such a manner that the circuit board 16 is arranged perpendicular to the base 20. That is, the drive circuit 17 is disposed upright on the base 20 so that the circuit board 16 extends in the sliding direction Y of the cover 30. The electronic component 15 is mounted on the circuit board 16 of the drive circuit 17 in such a way that a surface 15A thereof, which is opposite to the mounting surface of the electronic component 15, faces to one of the sidewalls 31 of the cover 30 and extends along the sliding direction Y of the cover 30.

A heat-conductive sheet 18 is thermally connected to and electrically isolated from the surface 15A of the electronic component 15 to serve as a heat-conductive member for conducting heat generated by the electronic component 15. The heat-conductive sheet 18 is formed in a rectangular sheet made of a silicon rubber material having adherence, thermal conductivity and electrically isolation property. The heat-conductive sheet 18 is formed substantially in the same rectangular shape as the surface 15A in plan view thereof. Heat generated by the electronic component 15 is transferred from the surface 15A to the heat-conductive sheet 18.

Figure 2:
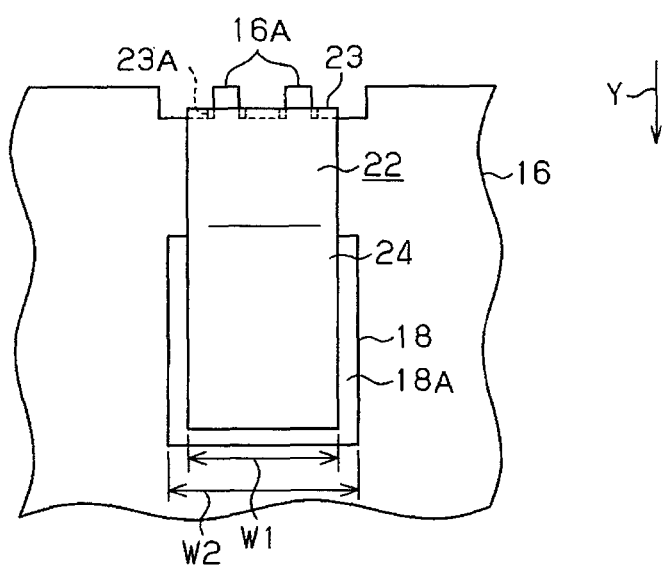
FIG. 2 is a partially enlarged front view showing a heat transfer plate mounted on a circuit board according to the preferred embodiment of the present invention.
Figure 4:
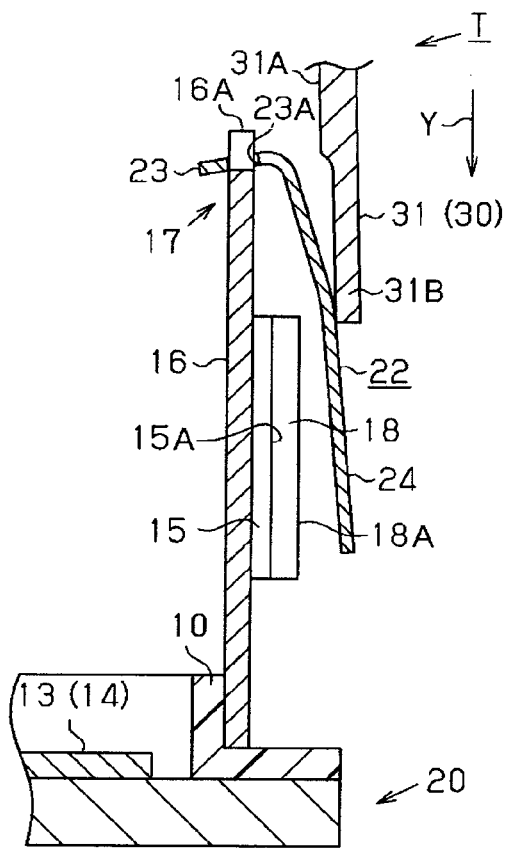
FIG. 4 is a partial cross-sectional view showing the heat transfer plate pressed by the sliding cover according to the preferred embodiment of the present invention.

As shown in FIG. 2, the circuit board 16 has at one end (an upper end in FIG. 2) thereof two engaging projections 16A for use in attaching to a heat transfer plate 22. As shown in FIG. 1, the heat transfer plate 22 is attached at one longitudinal end thereof to the upper end of the circuit board 16 and extends from the upper end of the circuit board 16 downwardly so as to cover the heat-conductive sheet 18. The heat transfer plate 22 is made of a ferrous material and formed in a rectangular plate. The heat transfer plate 22 is bent so as to have a bent top portion 23 and a heat transfer portion 24 extending from the bent top portion 23 downwardly to be formed in a gentle arc as shown in FIG. 4. As shown in FIG. 3, the bent top portion 23 is provided with a pair of engaging holes 23A for receiving therein the engaging projections 16A of the circuit board 16. Referring back to FIGS. 2 and 3, the opening of each engaging hole 23A is slightly larger than the periphery of the engaging projection 16A so that clearance is formed between the outer surface of the engaging projection 16A and the circumferential surface of the engaging hole 23A when the engaging projection 16A is engaged with the engaging hole 23A.

As shown in FIG. 2, the heat transfer portion 24 of the heat transfer plate 22 has a width W1 as measured in a direction perpendicular to the sliding direction Y of the cover 30. The heat-conductive sheet 18 has a surface 18A with a width W2 in the same direction as the width W1 of the heat transfer plate 22. As clearly shown in FIG. 2, the width W1 is slightly smaller than the width W2. The opposite edges of the heat transfer portion 24 in the width direction are located within the opposite edges of the surface 18A in the same width direction. That is, the opposite edges of the surface 18A of the heat-conductive sheet 18 extend laterally outward of the opposite ends of the heat transfer portion 24 of the heat transfer plate 22. On the other hand, the lower longitudinal end of the heat transfer portion 24 of the heat transfer plate 22 is located within the length of the surface 18A. That is, the lower end of the surface 18A extends outward from the heat transfer portion 24 in the longitudinal direction. Further, as shown in FIG. 3, the width W1 of the heat transfer portion 24 is slightly larger than the width W3 of the pressing protrusion 31A of the sidewall 31.

As shown in FIGS. 1 and 3, the pressing protrusion 31A of the sidewall 31 presses the heat transfer portion 24 of the heat transfer plate 22 against the surface 18A of the heat-conductive sheet 18. In this state, the sidewall 31 of the cover 30 is in pressing contact at the pressing protrusion 31A thereof with the heat transfer portion 24 of the heat transfer plate 22, the heat transfer portion 24 is in pressing contact with the surface 18A of the heat-conductive sheet 18 which is thermally connected to the surface 15A of the electronic component 15. According to the present preferred embodiment, a part of the heat transfer portion 24 of the heat transfer plate 22 serves as a contact portion to be kept in pressing contact with the surface 18A. The electronic component 15 is thermally connected to the sidewall 31 with the heat-conductive sheet 18 and the heat transfer portion 24 interposed therebetween so that heat generated by the electronic component 15 is dissipated to the sidewall 31 through the heat-conductive sheet 18 and the heat transfer portion 24.

The following will describe a method for mounting the electronic component 15 in the drive circuit 17 according to the preferred embodiment of the present invention.

Firstly, as shown in FIG. 4, the electronic component 15 is mounted on the circuit board 16 in such a manner that the electronic component 15 faces to the pressing protrusion 31A formed from the inner surface of the sidewall 31 of the cover 30, the heat-conductive sheet 18 is connected to the surface 15A of the electronic component 15 extending in the sliding direction Y of the cover 30 thereby to thermally connect the electronic component 15 and the heat-conductive sheet 18 together, and the circuit board 16 is disposed upright on the base 20. Subsequently, the engaging holes 23A of the heat transfer plate 22 are engaged with the engaging projections 16A of the circuit board 16 respectively. In this state, the bent top portion 23 of the heat transfer plate 22 is attached to the circuit board 16 so that the heat transfer plate 22 extends to cover the surface 18A of the heat-conductive sheet 18 with an inclination away from the surface 18A to the bottom of the sidewall 31. That is, the heat transfer plate 22 extends in the sliding direction Y of the cover 30 downwardly.

Next, the cover 30 is moved in sliding toward the base 20 so that the heat transfer portion 24 of the heat transfer plate 22 is pressed inward by the pressing protrusion 31A of the sidewall 31. Accordingly, the pressed heat transfer plate 22 is rotated around the parts of engagements between the engaging holes 23A and the engaging projections 16A toward the surface 18A of the heat-conductive sheet 18 as indicated by the solid and chain double-dashed lines in FIG. 5. The heat transfer plate 22 moves toward the surface 18A in a direction perpendicular to the surface 18A. Since each sidewall 31 of the cover 30 is inclined so as to increase the internal space N formed within the cover 30 to the bottom thereof, the pressing protrusion 31A comes close to the heat transfer portion 24 as the cover 30 is moved toward the base 20. Accordingly, the pressing protrusion 31A presses the heat transfer portion 24 with an increasing force.

When the cover 30 is placed with the lower ends 31B of the sidewalls 31 engaged with the frame 10 at the outer surface thereof, further movement of the cover 30 along the base 20 is restricted and the heat transfer portion 24 is kept pressed by the pressing protrusion 31A. In this state, the heat transfer portion 24 is also kept in pressing contact with the surface 18A of the heat-conductive sheet 18 connected to the surface 15A of the electronic component 15. Consequently, the electronic component 15 is thermally connected to the sidewall 31 through the heat-conductive sheet 18 and the heat transfer plate 22.

Further, with the cover 30 mounted on the base 20, as shown in FIG. 3, since the heat-conductive sheet 18 is pressed by the heat transfer portion 24 of the heat transfer plate 22, the opposite side portions of the heat-conductive sheet 18 are forced out of the heat transfer portion 24 in the width direction to expand toward the sidewall 31.

The structure and the method for mounting a heat-generating component according to the above-described preferred embodiment of the present invention offer the following advantageous effects.

(1) With the heat-conductive sheet 18 connected to the electronic component 15 mounted on the circuit board 16, the heat transfer plate 22 is attached to the circuit board 16 at one end thereof so as to cover the heat-conductive sheet 18. The sidewall 31 of the cover 30 being moved sliding toward the base 20 presses the heat transfer plate 22 against the heat-conductive sheet 18. Therefore, the heat transfer plate 22 is moved toward the heat-conductive sheet 18 in a direction perpendicular to the surface 18A thereby to press against the heat-conductive sheet 18. This prevents the heat-conductive sheet 18 from being dragged by the sliding cover 30 in the direction Y. Thus, the heat-conductive sheet 18 is free from any deformation caused by being dragged by the sliding cover 30. As a result, a sufficient contact area is ensured between the surface 15A of the electronic component 15 and the heat-conductive sheet 18 for successful heat dissipation.

(2) Since the heat transfer plate 22 is made of a ferrous material having a sufficient strength even with a reduced thickness, the heat transfer plate 22 is prevented from being deformed by the pressing force exerted by the sidewall 31 of the cover 30 sliding in the direction Y. Thus, the sliding movement of the cover 30 in the sliding direction Y allows the heat transfer plate 22 to press reliably against the heat-conductive sheet 18. Further, the heat transfer plate 22 can be made thinner without reducing the strength thereof, which restricts a decrease in thermal conductivity due to the heat transfer plate 22, with the result that heat dissipation from electronic component 15 to the cover 30 is performed effectively.

(3) The width W1 of the heat transfer portion 24 of the heat transfer plate 22 is slightly smaller than the width W2 of the surface 18A, and the width W3 of the pressing protrusion 31A of the sidewall 31 is smaller than the width W1 of the heat transfer portion 24. This ensures a minimum electrical isolation distance in width direction between the opposite sides of the electronic component 15 and the heat transfer portion 24. The pressing protrusion 31A, which presses the heat transfer portion 24, is located within the width W1 of the heat transfer portion 24. It is noted that if the sidewall 31 presses the heat transfer portion 24 without the pressing protrusion 31A, the minimum electrical isolation distance between the inner surface of the sidewall 31 and the opposite sides of the electronic component 15 in the width direction is not ensured. Thus, because of forming the pressing protrusion 31A with the width W3 that is smaller than the width W1 of the heat transfer portion 24, the minimum electrical isolation distance is ensured between the opposite sides of the electronic component 15 and the sidewall 31.

(4) The width W1 of the heat transfer portion 24 is slightly smaller than the width W2 of the surface 18A, which ensures a sufficient area where heat is conducted from the heat-conductive sheet 18 to the cover 30 with a minimum electrical isolation distance between the inner surface of the sidewall 31 and the opposite sides of the electronic component 15 in the width direction.

(5) Each sidewall 31 of the cover 30 is inclined from the top wall 32 so that the internal space N formed within the cover 30 is increases toward the bottom of the casing 11. Accordingly, when the cover 30 is moved sliding toward the base 20, the pressing protrusion 31A comes close to the heat transfer portion 24 as the cover 30 comes close to the base 20. As a result, the heat transfer portion 24 is reliably pressed against the surface 18A of the heat-conductive sheet 18.

(6) With the cover 30 mounted on the base 20 on which the frame 10 is disposed, each lower end 31B of the sidewall 31 is engaged with the outer surface of the frame 10. Thus, the movement of the cover 30 along the base 20 and the movement of the sidewall 31 pressing the heat transfer portion 24 are both restricted, so that the heat transfer portion 24 is kept pressed by the sidewall 31. Accordingly, the sidewall 31 and the heat transfer portion 24 are in pressing contact with each other, the heat transfer portion 24 and the heat-conductive sheet 18 are also in pressing contact with each other. Therefore, the heat-conductive sheet 18 connected to the electronic component 15 are kept in pressing contact with each other.

(7) With the engaging projection 16A of the circuit board 16 engaged with the engaging hole 23A of the heat transfer plate 22, clearance is formed between the outer surface of the engaging projection 16A and the circumferential surface of the engaging hole 23A. The clearance allows the heat transfer plate 22 to be attached at one end thereof to the circuit board 16 with such an inclination that the heat transfer plate 22 is away from the surface 18A at an increasing spaced distance toward the other end of the heat transfer plate 22. This enables the heat transfer plate 22 to be rotated toward the surface 18A in a direction perpendicular to the surface 18A as the cover 30 is moved sliding toward the base 20. Thus, the heat transfer plate 22 is prevented from moving together with the cover 30 in the sliding direction Y and the heat-conductive sheet 18 is prevented from being dragged by the cover 30 through the heat transfer plate 22 in the sliding direction Y.

(8) The heat transfer plate 22 is attached to the circuit board 16 using engagements between the engaging holes 23A and engaging projections 16A of the circuit board 16. Unlike a structure such as a screw being used for fixing the heat transfer plate 22 to one end of the circuit board 16, the heat transfer plate 22 of this embodiment is not pressed toward the lower end of the circuit board 16 in attaching the heat transfer plate 22 to one end of the circuit board 16. Thus, this structure prevents the heat-conductive sheet 18 from being dragged by the heat transfer plate 22 downwardly.

(9) The width W3 of the pressing protrusion 31A formed from the inner surface of the sidewall 31 is smaller than the width W1 of the heat transfer portion 24. By virtue of this structure, when the heat-conductive sheet 18 is expanded toward the sidewall 31 due to being pressed by the pressing protrusion 31A through the heat transfer portion 24, interference between the expanded heat-conductive sheet 18 and the inner surface of the sidewall 31 is prevented. Thus, the cover 30 is moved in the sliding direction Y without dragging the expanded heat-conductive sheet 18.

The present invention is not limited to the above-described preferred embodiment, but it may be variously modified within the scope of the invention. For example, the above embodiment may be modified as exemplified below.

Each sidewall 31 of the cover 30 does not necessarily need to be inclined from the upper end thereof at the top wall 32 toward the lower end thereof.

According to the preferred embodiment, the pressing protrusion 31A is formed from the inner surface of the sidewall 31. Alternatively, the inner surface of the sidewall 31 may be provided with recesses on both sides of the area of the inner surface of the sidewall 31 which is contactable with the heat transfer portion 24 so as to prevent interference between the expanded heat-conductive sheet 18 and the inner surface of the sidewall 31.

The heat transfer plate 22 may be a plate made of any highly thermally conductive material, such as aluminum alloy or copper.

According to the preferred embodiment, the cover 30 is formed of an integral box-shaped member having the top wall 32 and four sidewalls 31. Alternatively, it may be so arranged that one of the sidewalls 31 facing to the heat transfer plate 22 is removable from the cover 30. In this case, each of two sidewalls 31 adjacent to the removable sidewall 31 has a groove extending from the top wall 32 toward the lower end thereof, along which the removable sidewall 31 is moved sliding with the opposite side edges thereof engaged with the grooves. In assembling the cover 30 of such structure, the sidewalls 31 of the cover 30 except the removable sidewall 31 are mounted to the base 20 previously. Then, the removable sidewall 31 is moved sliding toward the base 20 with the opposite side edges thereof engaged with the grooves. The removable sidewall 31 thus sliding downward presses the heat transfer plate 22 against the heat-conductive sheet 18, thereby pressing the heat-conductive sheet 18 against the surface 15A of the electronic component 15.

The heat transfer plate 22 may be attached to the circuit board 16 through a bracket provided in the casing 11.

The pressing protrusion 31A may be formed extending from the upper end at the top wall 32 all the way to the lower end of the sidewall 31.

The heat-conductive sheet 18 is not necessarily adhesive.

Although the present invention is embodied in the structure and the method for mounting the electronic component 15 used in the electronic control unit T for the industrial vehicle, it may be embodied in a structure and a method for mounting a heat-generating component used in any other vehicle such as an electric vehicle.

What is claimed:

1. A structure for mounting a heat-generating component, comprising:
    a circuit board on which a heat-generating component is mounted;
    a base on which the circuit board is disposed upright;
    a cover being made of a material having thermal conductivity, the cover is slidably movable toward the base along the vertical surface of the circuit board to be mounted on the base;
    a heat-conductive member being thermally connected to and electrically isolated from a surface of the heat-generating component; and
    a heat transfer plate being attached at one end thereof to the circuit board so as to extend in the sliding direction of the cover to cover a surface of the heat-conductive member,
    wherein the cover presses the heat transfer plate by an inner surface thereof against the heat-conductive member in a direction perpendicular to the surface of the heat-conductive member so that the heat-generating component is thermally connected to the inner surface of the cover through the heat-conductive member and the heat transfer plate.

2. The structure for mounting a heat-generating component according to claim 1, wherein the heat transfer plate is in the form of a rectangular plate made of a ferrous material.

3. The structure for mounting a heat-generating component according to claim 1, further comprising an engaging hole provided at one end of the heat transfer plate, and an engaging projection formed at one end of the circuit board for engaging with the engaging hole to attach the heat transfer plate to the circuit board, wherein the opening of the engaging hole is larger than the periphery of the engaging projection so as to form clearance therebetween.

4. The structure for mounting a heat-generating component according to claim 1, further comprising a pressing protrusion formed from the inner surface of the cover for pressing the heat transfer plate, wherein the pressing protrusion has a width smaller than a width of the heat transfer plate as measured in a direction perpendicular to the sliding direction of the cover, wherein the width of the heat transfer plate is smaller than a width of the surface of the heat-conductive member.

5. The structure for mounting a heat-generating component according to claim 1, wherein the cover is formed of a top wall and sidewalls extending downward from edges of the top wall, each sidewall of the cover defining an internal space of the cover is inclined outwardly from the top wall to the lower end thereof.

6. The structure for mounting a heat-generating component according to claim 1, further comprising a positioning means for positioning the cover with respect to the base when the cover is mounted on the base.

7. The structure for mounting a heat-generating component according to claim 1, wherein the heat-conductive member is made of a silicon rubber material in the form of a sheet having adherence, thermal conductivity and electrically isolation property.

8. A method for mounting a heat-generating component, comprising the steps of:
    mounting a heat-generating component on a circuit board;
    connecting thermally a heat-conductive member to a surface of the heat-generating component;
    disposing the circuit board upright on a base;

attaching a heat transfer plate at one end thereof to the circuit board so as to extend to cover a surface of the heat-conductive member with an inclination away from the heat-conductive member with a distance from the one end of the heat transfer plate to the other end, and sliding the cover having thermal conductivity from the one end of the heat transfer plate to the base so that the heat transfer plate is moved toward the heat-conductive member in a direction perpendicular to the surface of the heat-conductive member, whereby the heat-generating component is thermally connected to the cover through the heat-conductive member and the heat transfer plate.

9. The method for mounting a heat-generating component according to claim 8, further comprising the steps of:

forming an engaging projection at one end of the circuit board;

forming an engaging hole at one end of the heat transfer plate so that the opening of the engaging hole is set larger than the periphery of the engaging projection, and attaching the heat transfer plate to the circuit board by engaging the engaging hole to the engaging projection.

* * * * *